(12) United States Patent
Nishioka

(10) Patent No.: US 11,275,111 B2
(45) Date of Patent: Mar. 15, 2022

(54) PLURALITY OF EDGE THROUGH-SILICON VIAS AND RELATED SYSTEMS, METHODS, AND DEVICES

(71) Applicant: Micron Technology, Inc., Boise, ID (US)

(72) Inventor: Naohisa Nishioka, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 208 days.

(21) Appl. No.: 16/577,243

(22) Filed: Sep. 20, 2019

(65) Prior Publication Data

US 2021/0088586 A1  Mar. 25, 2021

(51) Int. Cl.
*G01R 31/317* (2006.01)
*H01L 25/065* (2006.01)
*G11C 29/02* (2006.01)
*G01R 31/28* (2006.01)

(52) U.S. Cl.
CPC ... *G01R 31/31717* (2013.01); *G01R 31/2853* (2013.01); *G11C 29/022* (2013.01); *H01L 25/0657* (2013.01); *H01L 2225/06541* (2013.01)

(58) Field of Classification Search
CPC ........ G01R 31/3004; G01R 31/318513; G01R 31/31924
See application file for complete search history.

(56) References Cited

U.S. PATENT DOCUMENTS

| | | | |
|---|---|---|---|
| 8,285,193 B2 | 10/2012 | Saeki | |
| 8,956,889 B2 | 2/2015 | Lin et al. | |
| 8,981,808 B2 | 3/2015 | Nishioka | |
| 9,312,031 B2 | 4/2016 | Nishioka | |
| 9,436,639 B1 | 9/2016 | Dalal et al. | |
| 2008/0203388 A1 | 8/2008 | He et al. | |
| 2014/0191410 A1 | 7/2014 | Letherman et al. | |
| 2015/0185274 A1* | 7/2015 | Hwang | G01R 31/318513 324/750.3 |
| 2015/0303120 A1* | 10/2015 | Zhang | H01L 24/02 257/738 |
| 2016/0099230 A1* | 4/2016 | Kang | H01L 25/0657 438/4 |
| 2019/0096776 A1 | 3/2019 | Nishioka | |

FOREIGN PATENT DOCUMENTS

CN 103063876 B 8/2014

* cited by examiner

*Primary Examiner* — Tung X Nguyen
(74) *Attorney, Agent, or Firm* — TraskBritt

(57) ABSTRACT

Disclosed is a plurality of through-silicon vias (TSVs) and related systems, methods, and devices. An electronic device includes a stack of chips, a first TSV, and a second TSV. The stack of chips includes one or more side edges at a perimeter of the stack of chips. A TSV zone of the stack of chips is within a predetermined distance from the one or more side edges. The first TSV is within the TSV zone of the stack of chips at a first distance from the one or more side edges. The second TSV is within the TSV zone of the stack of chips at a second distance from the one or more side edges. The second distance is shorter than the first distance.

20 Claims, 11 Drawing Sheets

PLURALITY OF EDGE THROUGH-SILICON VIAS AND RELATED SYSTEMS, METHODS, AND DEVICES

TECHNICAL FIELD

The present disclosure relates, generally, to identifying a minimum acceptable through-silicon via (TSV) distance from side edges of a stack of chips, and more specifically to identifying minimum acceptable TSV distances in memory devices.

BACKGROUND

Three dimensional integrated circuits may be formed by stacking semiconductor chips having electronic circuitry formed therein or thereon. These stacked semiconductor chips may be interconnected vertically. For example, the stacked semiconductor chips may be interconnected using TSVs.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
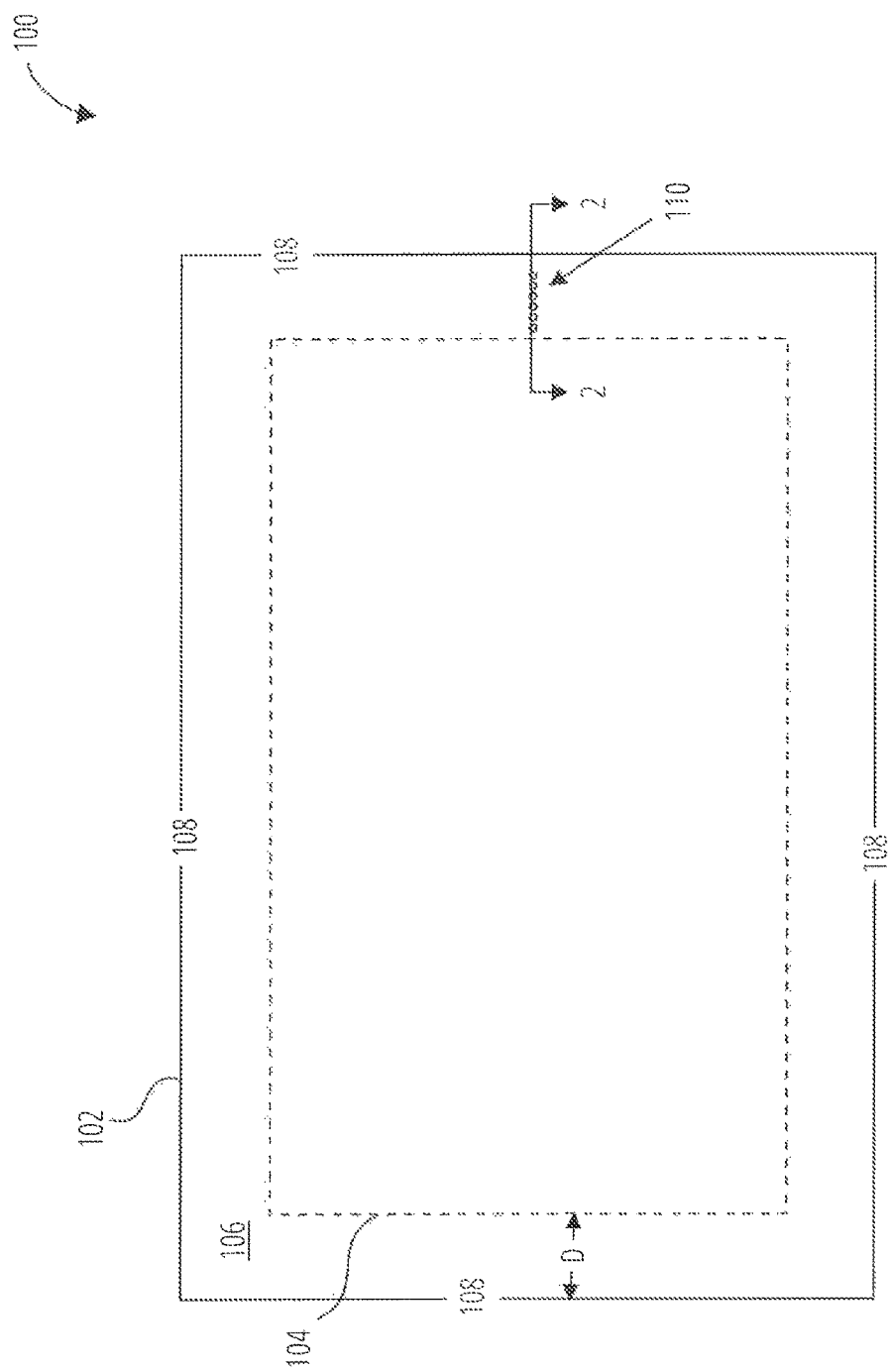
FIG. 1 is a top view of an electronic device, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein the term "chip" refers to a semiconductor wafer (e.g., a silicon wafer) having electronic circuitry formed therein or thereon. Examples of chips include memory logic chips, memory core chips, central processing unit chips, and other electronic device chips.

In some embodiments an electronic device includes a stack of chips, a first TSV, and a second TSV. The stack of chips includes one or more side edges at a perimeter of the stack of chips. A through-silicon via zone (TSV zone) of the stack of chips is within a predetermined distance from the one or more side edges. The first TSV is within the TSV zone of the stack of chips at a first distance from the one or more side edges. The second TSV is within the TSV zone of the stack of chips at a second distance from the one or more side edges. The second distance is shorter than the first distance.

In some embodiments a method of determining a minimum acceptable TSV distance from one or more side edges of a stack of chips includes performing a conductivity test on a first TSV located a first distance from the one or more side edges of the stack of chips; performing the conductivity test on a second TSV located a second distance from the one or more side edges, the second distance shorter than the first distance; and determining the minimum acceptable TSV distance from the one or more side edges to be the first distance responsive to a determination that the first TSV passed the conductivity test, the second TSV failed the conductivity test, and no other TSVs further from the one or more side edges than the first TSV failed the conductivity test.

In some embodiments a memory device includes a stack of chips, a plurality of TSVs, and control circuitry. The stack of chips includes a logic die and a plurality of core dies stacked on the logic die. The plurality of TSVs are located at different distances from one or more side edges of the stack of chips. An ordered sequence is associated with the plurality of TSVs from a furthest TSV from the one or more side edges to a nearest TSV to the one or more side edges. The control circuitry is on or in the logic die. The control circuitry is configured to perform a conductivity test on each of the plurality of TSVs; identify a TSV of the plurality of TSVs that is a last consecutive TSV in the ordered sequence to pass the conductivity test with no preceding TSVs in the ordered sequence failing the conductivity test; and determine a minimum acceptable TSV distance from the one or more side edges to be the same as a distance from the identified TSV to the one or more side edges.

FIG. 1 is a top view of an electronic device 100, according to some embodiments. The electronic device 100 includes a stack of chips 102 including one or more side edges 108 at a perimeter of the stack of chips 102, a TSV zone 106 of the stack of chips 102 within a predetermined distance D (e.g., 230 microns (um)) from the one or more side edges 108. The TSV zone 106 is defined by the side edges 108 and a TSV zone border 104 shown in FIG. 1. The electronic device 100 also includes TSVs 110 located at various distances from the side edges 108.

Figure 2:
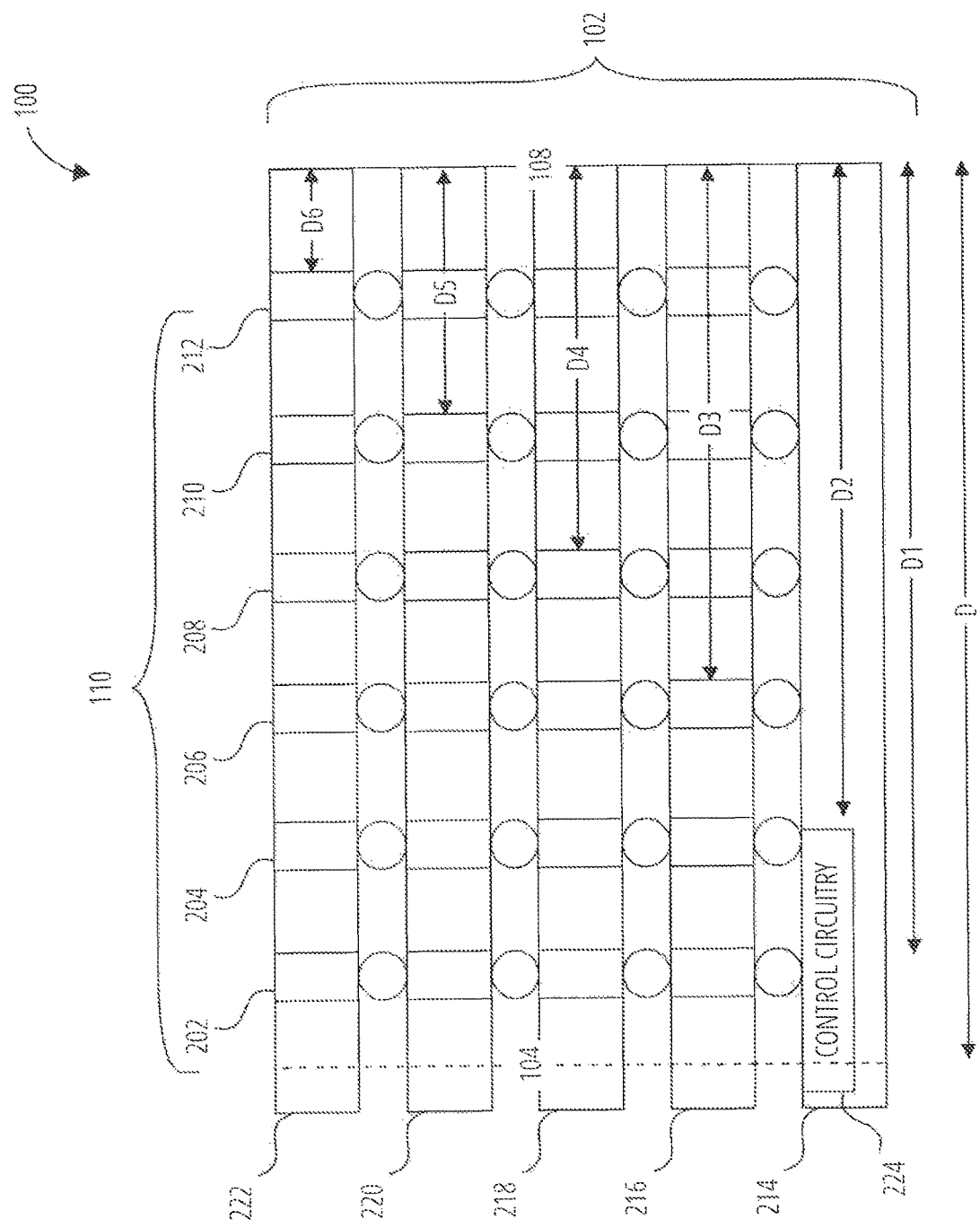
FIG. 2 is a cross-sectional view of a portion of the electronic device of FIG. 1, the cross-section taken at cross-section 2 of FIG. 1.

FIG. 2 is a cross-sectional view of a portion of the electronic device 100 of FIG. 1, the cross-section taken at cross-section 2 of FIG. 1. Referring to FIG. 1 and FIG. 2 together, the electronic device 100 includes a plurality of chips. For example, the stack of chips 102 includes chip 214, chip 216, chip 218, chip 220, and chip 222. It should be noted that the stack of chips 102 may include any number of chips greater than or equal to two chips.

One of the chips of the stack of chips 102 includes control circuitry 224 therein or thereon. The chip that includes the control circuitry 224 may sometimes be referred to herein as a "control chip." In some embodiments a bottom chip 214 in the stack of chips 102 may include the control circuitry 224, such as in the example illustrated in FIG. 2. In some embodiments a top chip (e.g., chip 222) may include the control circuitry 224. As a specific non-limiting example, the chip 214 may include a logic die of a memory device, chip 216, chip 218, chip 220, and chip 222 may include memory core chips, and the control circuitry 224 may include a direct access (DA) control circuit.

The stack of chips 102 also includes the TSVs 110 including TSV 202, TSV 204, TSV 206, TSV 208, TSV 210, and TSV 212 within the TSV zone 106 of the stack of chips 102. Although FIG. 1 and FIG. 2 illustrate six TSVs 110, the electronic device 100 may include any number of TSVs greater than or equal to two TSVs. Each of the TSVs 110 is located a different distance from the side edges 108 of the stack of chips 102. For example, TSV 202 is located a distance D1 from the side edges 108; TSV 204 is located a distance D2 from the side edges 108; TSV 206 is located a distance D3 from the side edges 108; TSV 208 is located a distance D4 from the side edges 108; TSV 210 is located a distance D5 from the side edges 108; and TSV 212 is located a distance D6 from the side edges 108.

With the TSVs 110 arranged at different distances from the side edges 108, the control circuitry 224 is configured to perform a conductivity test on each of the TSVs 110 and use results of the conductivity tests to identify a minimum acceptable TSV distance from the side edges 108. In other words, the control circuitry 224 is configured to use results of the conductivity tests to identify a limit where well-formed TSVs may be formed. If a first conductivity test of a first one of the TSVs 110 reveals no problem and a second conductivity test of a second one of the TSVs 110 arranged next to the first one of the TSVs 110 reveals an open circuit, the limit may be determined to be the distance to the first one of the TSVs 110. Stated another way, the control circuitry 224 is configured to perform a conductivity test on the TSVs 110 and identify the minimum acceptable TSV distance from the side edges 108 to be a first distance corresponding to a first one of the TSVs 110 responsive to a determination that the first TSV one of the TSVs 110 passed the conductivity test, a second one of the TSVs 110 adjacent to the first one of the TSVs 110 failed the conductivity test, and no others of the TSVs 110 further from the side edges than the first one of the TSVs 110 failed the conductivity test.

Stated still another way, an ordered sequence may be associated with the TSVs 110 from a furthest TSV (TSV 202) from the side edges 108 to a nearest TSV (TSV 212) to the side edges 108. The control circuitry 224 is configured to perform a conductivity test on each of the TSVs 110, identify one of the TSVs 110 that is a last consecutive TSV in the ordered sequence to pass the conductivity test with no preceding TSVs in the ordered sequence failing the conductivity test. The control circuitry 224 is further configured to determine a minimum acceptable TSV distance from the side edges 108 to be the same as a distance from the identified TSV to the side edges 108.

As a specific non-limiting example, the control circuitry 224 may perform conductivity tests on each of TSVs 110 resulting in no problems in the TSV 202, the TSV 204, the TSV 206, and the TSV 208 and open circuits in TSV 210 and TSV 212. In this example the minimum acceptable TSV distance, or limit where well-formed TSVs can be formed, may be determined to be the distance D4 of the TSV 208 from the side edges 108.

The use of multiple TSVs 110 to determine the minimum acceptable TSV distance, as compared to the use of a single TSV allows multiple different distances (e.g., D1, D2, D3, D4, D5, and D6) from the side edges 108 to be assessed instead of a single distance. Where only a single TSV is used it may only be determined that the distance of that single TSV from the side edges 108 is either acceptable or not acceptable without providing the granularity afforded by multiple TSVs.

Figure 3:
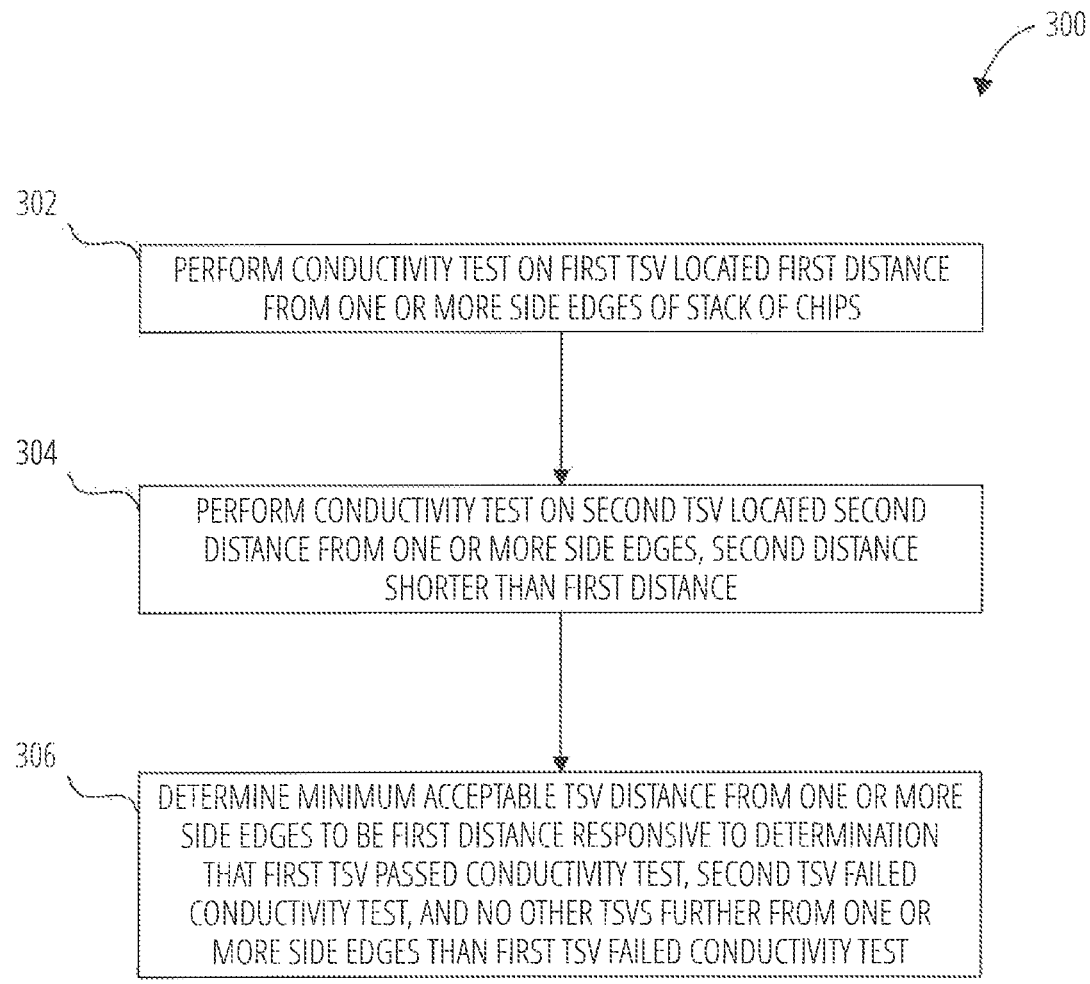
FIG. 3 is a flowchart illustrating a method of determining a minimum acceptable TSV distance from one or more side edges of a stack of chips, according to some embodiments.
Figure 4:
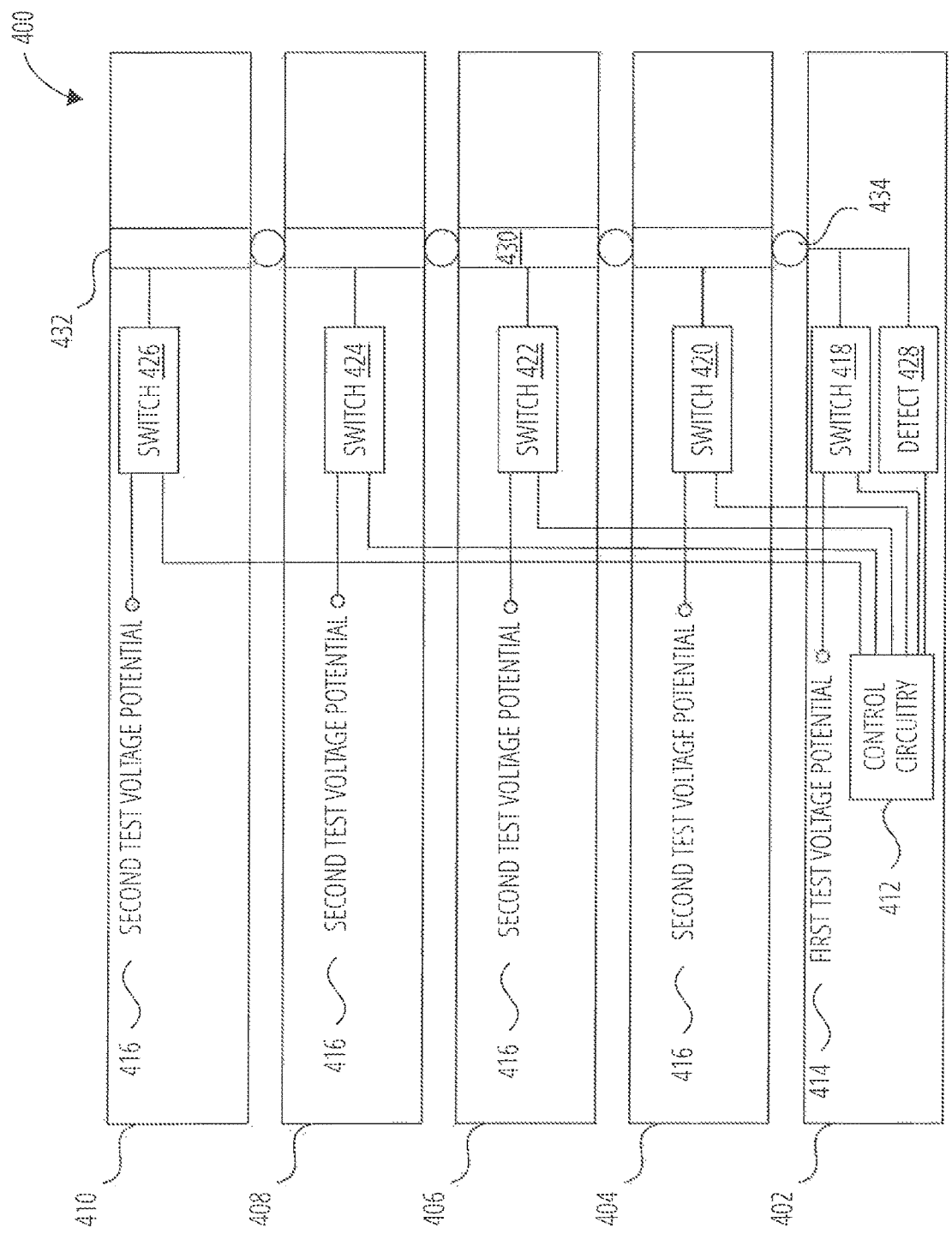
FIG. 4 is a cross-sectional view of a stack of chips, according to some embodiments.
Figure 5:
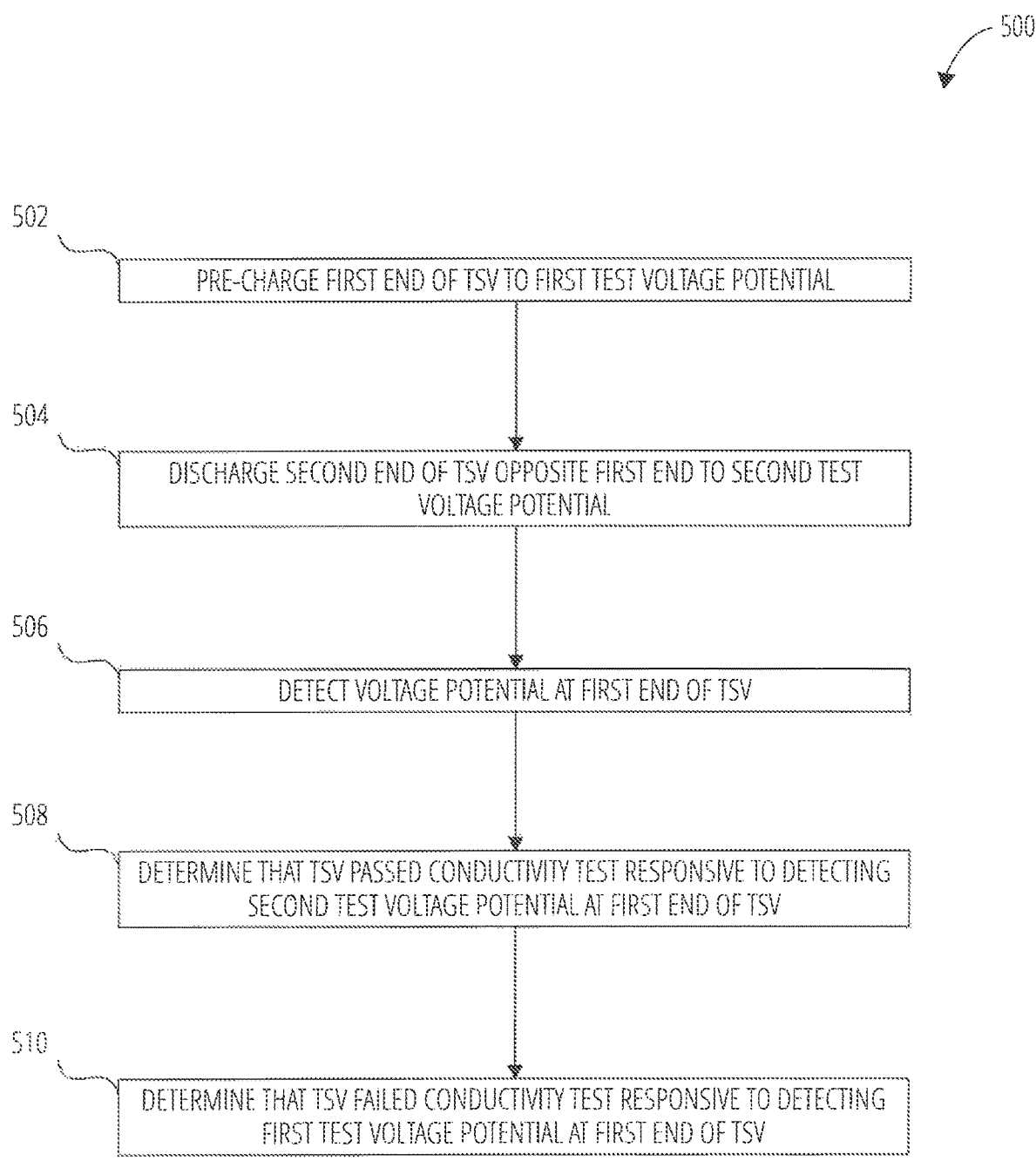
FIG. 5 is a flowchart illustrating a method of performing a conductivity test, according to some embodiments.

FIG. 3 is a flowchart illustrating a method 300 of determining a minimum acceptable TSV distance from one or more side edges of a stack of chips, according to some embodiments. In operation 302, method 300 performs a conductivity test on a first TSV located a first distance from the one or more side edges of the stack of chips. FIG. 4 and FIG. 5 below provides details regarding an example of a conductivity test.

In operation 304, method 300 performs the conductivity test on a second TSV located a second distance from the one or more side edges. The second distance is shorter than the first distance. In operation 306, method 300 determines the minimum acceptable TSV distance from the one or more side edges to be the first distance responsive to a determination that the first TSV passed the conductivity test, the second TSV failed the conductivity test, and no other TSVs further from the one or more side edges than the first TSV failed the conductivity test.

FIG. 4 is a cross-sectional view of a stack of chips 400, according to some embodiments. The stack of chips 400 includes a control chip 402 at the bottom of the stack of chips 400, an end chip 410 at the top of the stack of chips 400, and intervening chips (chip 404, chip 406, and chip 408) between the control chip 402 and the end chip 410. The stack of chips 400 also includes a TSV 430 traversing the stack of chips 400. The TSV 430 includes a first end 434 proximate to the control chip 402 and a second end 432 proximate to the end chip 410.

The control chip 402 includes control circuitry 412 similar to the control circuitry 224 of FIG. 2. The control chip 402 also includes a switch 418 and detection circuitry 428. The switch 418 is operably coupled between a first test voltage potential 414 and the first end 434 of the TSV 430. A control input of the switch 418 is operably coupled to the control circuitry 412 to enable the control circuitry 412 to open and close the switch 418. The switch 418 is configured to selectively operably couple and electrically isolate the first end 434 of the TSV 430 to and from the first test voltage potential 414 responsive to control of the control circuitry 412. The detection circuitry 428 is configured to detect a voltage potential of the first end 434 of the TSV 430. The detection circuitry 428 is operably coupled to the control circuitry 412 to provide the detected voltage potential of the first end 434 of the TSV 430 to the control circuitry 412.

The end chip 410 includes a switch 426 operably coupled between a second test voltage potential 416 and the second end 432 of the TSV 430. A control input of the switch 426 is operably coupled to the control circuitry 412 to enable the control circuitry 412 to open and close the switch 426. The switch 418 is configured to selectively operably couple and electrically isolate the second end 432 of the TSV 430 to and from the second test voltage potential 416 responsive to control of the control circuitry 412.

The intervening chips, chip 404, chip 406, and chip 408, include switches, switch 420, switch 422, and switch 424, respectively, operably coupled between the second test voltage potential 416 and the TSV 430. Control inputs of the switch 420, the chip 406, and the chip 408 are operably coupled to the control circuitry 412 to enable the control circuitry 412 to open and close the switch 420, switch 422, and switch 424. The switches, switch 420, switch 422, and switch 424, are configured to selectively operably couple and electrically isolate the TSV 430 to and from the second test voltage potential 416 at their respective locations along the TSV 430 responsive to control of the control circuitry 412.

Signals (e.g., signals to control the switch 420, switch 422, switch 424, and switch 426) may be transmitted between the control chip 402 and the other chips of the stack of chips 400 (chip 404, chip 406, chip 408, and end chip 410) using spiral-type TSVs.

The control circuitry 412 is configured to perform a conductivity test on the second end 432. An example of a conductivity test is discussed below with reference to FIG. 5. Although only one TSV 430 is shown in FIG. 4, it will be understood that the stack of chips 400 may include multiple TSVs, such as the electronic device 100 of FIG. 1 and FIG. 2 and that similar conductivity tests may be performed on each of the TSVs.

FIG. 5 is a flowchart illustrating a method 500 of performing a conductivity test, according to some embodiments. Referring to FIG. 4 and FIG. 5 together, in operation 502, method 500 pre-charges a first end 434 of the TSV 430 to a first test voltage potential 414. In some embodiments pre-charging the first end 434 of the TSV 430 to the first test voltage potential 414 includes activating a switch 418 operably coupled between the first end 434 of the TSV 430 and the first test voltage potential 414 until the first end 434 of the TSV 430 is charged to the first test voltage potential 414.

In operation 504, method 500 discharges a second end 432 of the TSV 430 opposite the first end 434 to a second test voltage potential 416. In some embodiments discharging the second end 432 of the TSV 430 to the second test voltage potential 416 includes activating a switch 426 operably coupled between the second end 432 of the TSV 430 and the second test voltage potential 416 until the second end 432 of the TSV 430 is discharged to the second test voltage potential 416.

In operation 506, method 500 detects a voltage potential at the first end 434 of the TSV 430. In some embodiments detecting the voltage potential at the first end 434 of the TSV 430 includes detecting the voltage potential using the detection circuitry 428. If the conductivity of the TSV 430 is good, the discharging of the second end 432 of the TSV 430 to the second test voltage potential 416 in operation 504 discharges the entire TSV 430 from the second end 432 to the first end 434 to the second test voltage potential 416. As a result, if the conductivity of the TSV 430 is good, the detected voltage potential at the first end 434 of the TSV 430 following the discharging of operation 504 will be at the second test voltage potential 416. If, on the other hand, the conductivity of the TSV 430 is poor (e.g., an open circuit at some point such as connection points between dies or the TSV 430 itself was not formed well) the detected voltage potential at the first end 434 of the TSV 430 following the discharging of operation 504 will not be at the second test voltage potential 416. For example, the voltage potential at the first end 434 may remain at the first test voltage potential 414 are end up at some other voltage potential between the first test voltage potential 414 and the second test voltage potential 416.

In operation 508, method 500 determines that the TSV 430 passed the conductivity test responsive to detecting the second test voltage potential 416 at the first end 434 of the TSV 430. In operation 510, method 500 determines that the TSV 430 failed the conductivity test responsive to detecting the first test voltage potential 414 at the first end 434 of the TSV 430.

If it is determined that the TSV 430 failed the conductivity test, the method 500 may be repeated for each of the intervening chips of the stack of chips 400 (chip 404, chip 406, and chip 408) instead of the end chip 410 to identify a location of the fault in the TSV 430. For example, if the TSV 430 is faulty at a connection between chip 404 and chip 406, the TSV 430 would pass the conductivity test between chip 404 and the control chip 402, but the TSV 430 would fail the conductivity test between the control chip 402 and each of chip 406, chip 408, and end chip 410.

Figure 6:
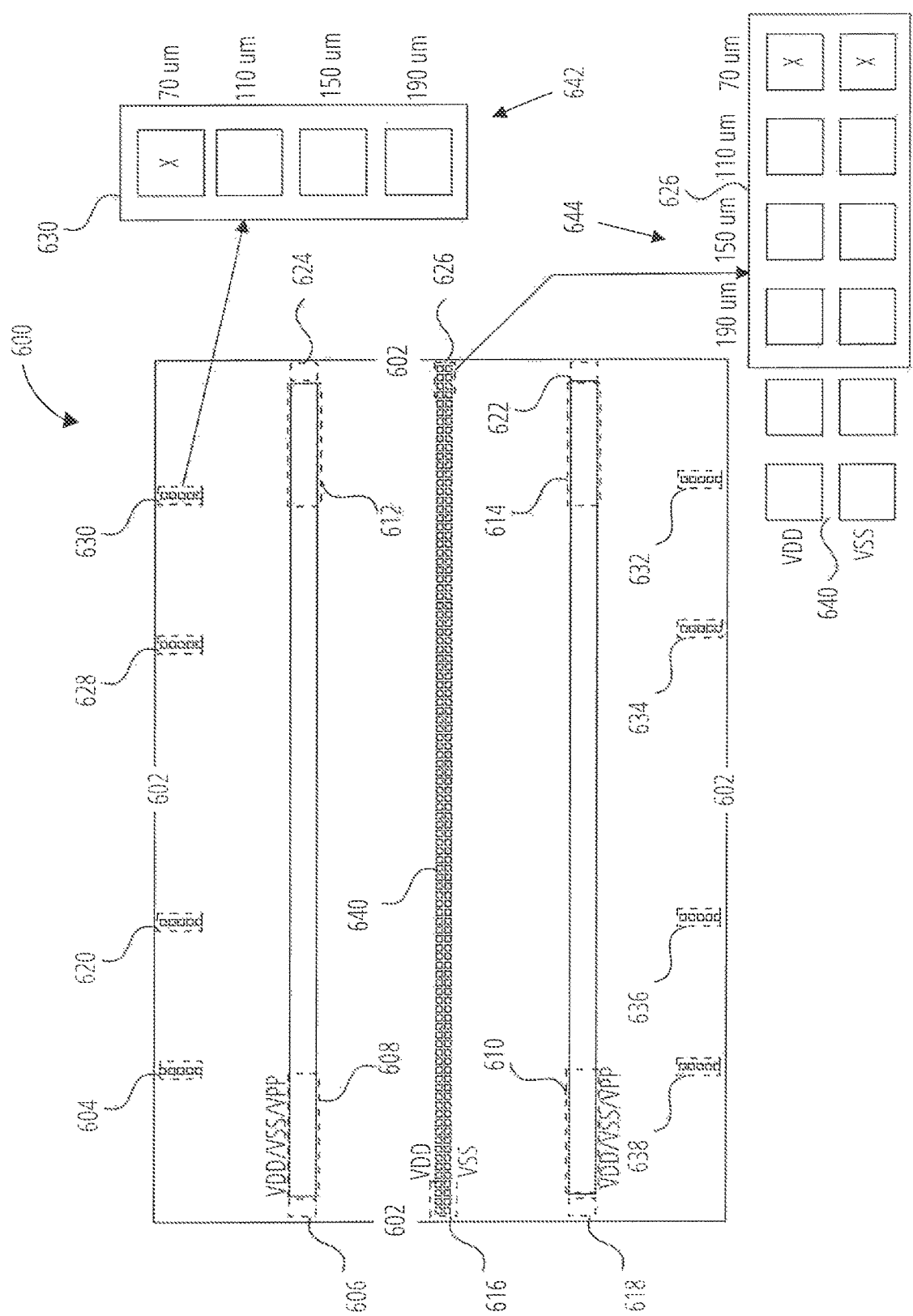
FIG. 6 is a top view of a stack of chips, according to some embodiments.

FIG. 6 is a top view of a stack of chips 600, according to some embodiments. The stack of chips 600 may be similar to the electronic device 100 of FIG. 1 and FIG. 2, and to the stack of chips 400 of FIG. 4. The stack of chips 600 includes several sets of edge TSVs (edge TSVs 604, edge TSVs 620, edge TSVs 628, edge TSVs 630, edge TSVs 632, edge TSVs 634, edge TSVs 638), VDD/VSS/VPP TSVs (VDD/VSS/VPP TSVs 608, VDD/VSS/VPP TSVs 610, VDD/VSS/VPP TSVs 612, VDD/VSS/VPP TSVs 614), and VDD/VSS TSVs 640. The VDD/VSS/VPP TSVs include VDD/VSS/VPP edge TSVs (VDD/VSS/VPP edge TSVs 606, VDD/VSS/VPP edge TSVs 618, VDD/VSS/VPP edge TSVs 624, VDD/VSS/VPP edge TSVs 622). The VDD/VSS TSVs 640 include VDD/VSS edge TSVs 626 and VDD/VSS edge TSVs 616.

With various sets of TSVs arranged at side edges 602 of the stack of chips 600, a limit region or minimum acceptable TSV distance for placing TSVs at the edge region (e.g., TSV zone 106 of FIG. 1) may be determined (e.g., using the method 300 of FIG. 3 and the method 500 of FIG. 5). In some embodiments this minimum acceptable TSV distance may be determined globally (e.g., by selecting a maximum one of the minimum acceptable TSV distances for each of the sets of edge TSVs including the edge TSVs, the VDD/VSS edge TSVs and the VDD/VSS/VPP edge TSVs). By placing test TSVs along each of the side edges 602 of the stack of chips 600, however, the minimum acceptable TSV distance may be determined independently for each of the side edges 602. Accordingly, in some embodiments minimum acceptable TSV distances may be determined independently for each one of the side edges 602 of the stack of chips 600. In some embodiments minimum acceptable TSV distances may be determined for each set of edge TSVs including the edge TSVs, the VDD/VSS edge TSVs and the VDD/VSS/VPP edge TSVs.

As a specific non-limiting example, the edge TSVs 630 may include a TSV at each of 70 um, 110 um, 150 um, and 190 um from the side edges 602, as shown in an exploded view 642 of the edge TSVs 630. In this example it may be determined that the TSVs at 110 um, 150 um, and 190 um pass the conductivity test, and the TSV at 70 um fails the conductivity test. As a result, 110 um may be selected as the minimum acceptable TSV distance for the edge TSVs 630, for the side edge of the stack of chips 600 that is proximate to the edge TSVs 630, or for the entire stack of chips 600.

As another specific non-limiting example, the VDD/VSS edge TSVs 626 may include two TSVs (one for VDD and one for VSS) at each of 70 um, 110 um, 150 um, and 190 um from the side edges 602, as shown in an exploded view 644 of the VDD/VSS edge TSVs 626. In this example it may be determined that the TSVs at 110 um, 150 um, and 190 um pass the conductivity test, and at least one of the TSVs at 70 um fails the conductivity test. As a result, 110 um may be selected as the minimum acceptable TSV distance for the VDD/VSS edge TSVs 626, for the side edge of the stack of chips 600 that is proximate to the VDD/VSS edge TSVs 626, or for the entire stack of chips 600.

In some embodiments increasing a number of TSVs for power rail voltages (e.g., VSS, VDD, VPP, etc.) may lower an impedance of the stack of chips 600 looking into the power supplies providing the power rail voltages. Using embodiments disclosed herein it may be determined how many extra TSVs may be placed near the side edges 602 for each set of VDD/VSS/VPP TSVs and VDD/VSS TSVs, thereby decreasing the impedance as compared to previously known systems.

Figure 7:
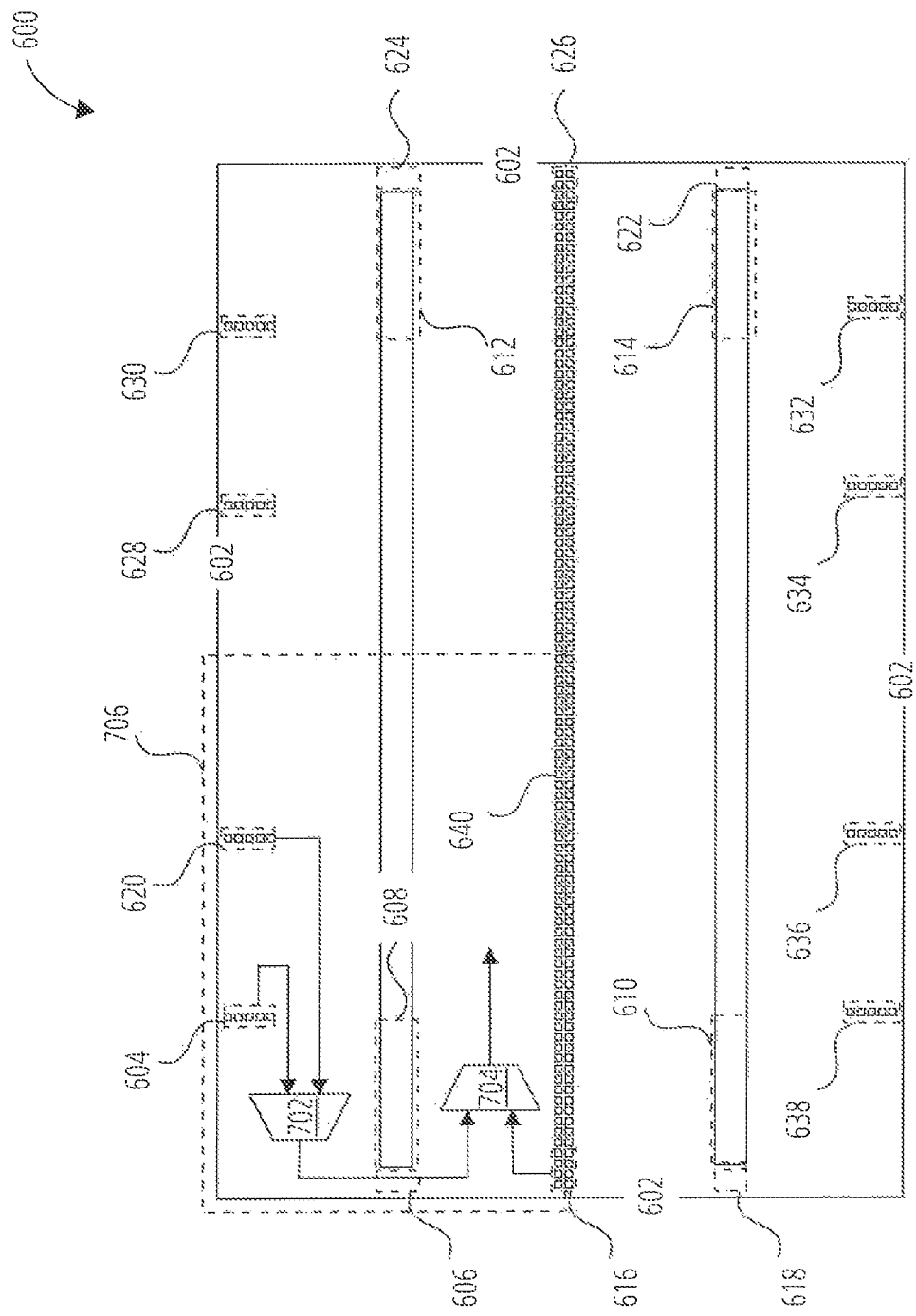
FIG. 7 is a top view of the stack of chips of FIG. 6 illustrating an example of signal management, according to some embodiments.

FIG. 7 is a top view of the stack of chips 600 of FIG. 6 illustrating an example of signal management, according to some embodiments. In a top left quarter 706 of the stack of chips 600, from the perspective of looking down at the stack of chips 600 in FIG. 6, some signal management is illustrated for outputting results of the conductivity tests. For example, the stack of chips 600 may include (e.g., in the control chip) local multiplexers (e.g., local multiplexer 702, local multiplexer 704) configured to deliver results of the conductivity tests from each of the TSVs in each of the TSV groups. In FIG. 7 local multiplexer 702 multiplexes the results from the edge TSVs 604 and the edge TSVs 620, and the local multiplexer 704 multiplexes the results of the VDD/VSS edge TSVs 616 and the output of the local multiplexer 702. Accordingly, the local multiplexer 704 may selectively provide the results from the edge TSVs 620, the edge TSVs 604, or the VDD/VSS edge TSVs 616 responsive to controls applied thereto (e.g., provided by the control circuitry). Although not shown, the stack of chips 600 may include additional local multiplexers configured to multiplex results from the conductivity tests of the other edge TSVs (e.g., edge TSVs 628, edge TSVs 630, VDD/VSS/VPP edge TSVs 624, VDD/VSS edge TSVs 626, VDD/VSS/VPP edge TSVs 622, edge TSVs 632, edge TSVs 634, edge TSVs 636, edge TSVs 638, VDD/VSS/VPP edge TSVs 618, VDD/VSS/VPP edge TSVs 606).

In some embodiments the results of the conductivity tests may be output sequentially (e.g., serially, one at a time on a single bus). In some embodiments the results of the conductivity tests may be output in parallel (e.g., simultaneously on sufficient test buses to carry all of the results at once). In some embodiments some intermediate multiplexing may take place. For example, a number of buses to transmit the results of the conductivity tests may be less than a number of results of the conductivity tests, and each of the buses transmits a sequential series of a different portion of the results.

Figure 8:
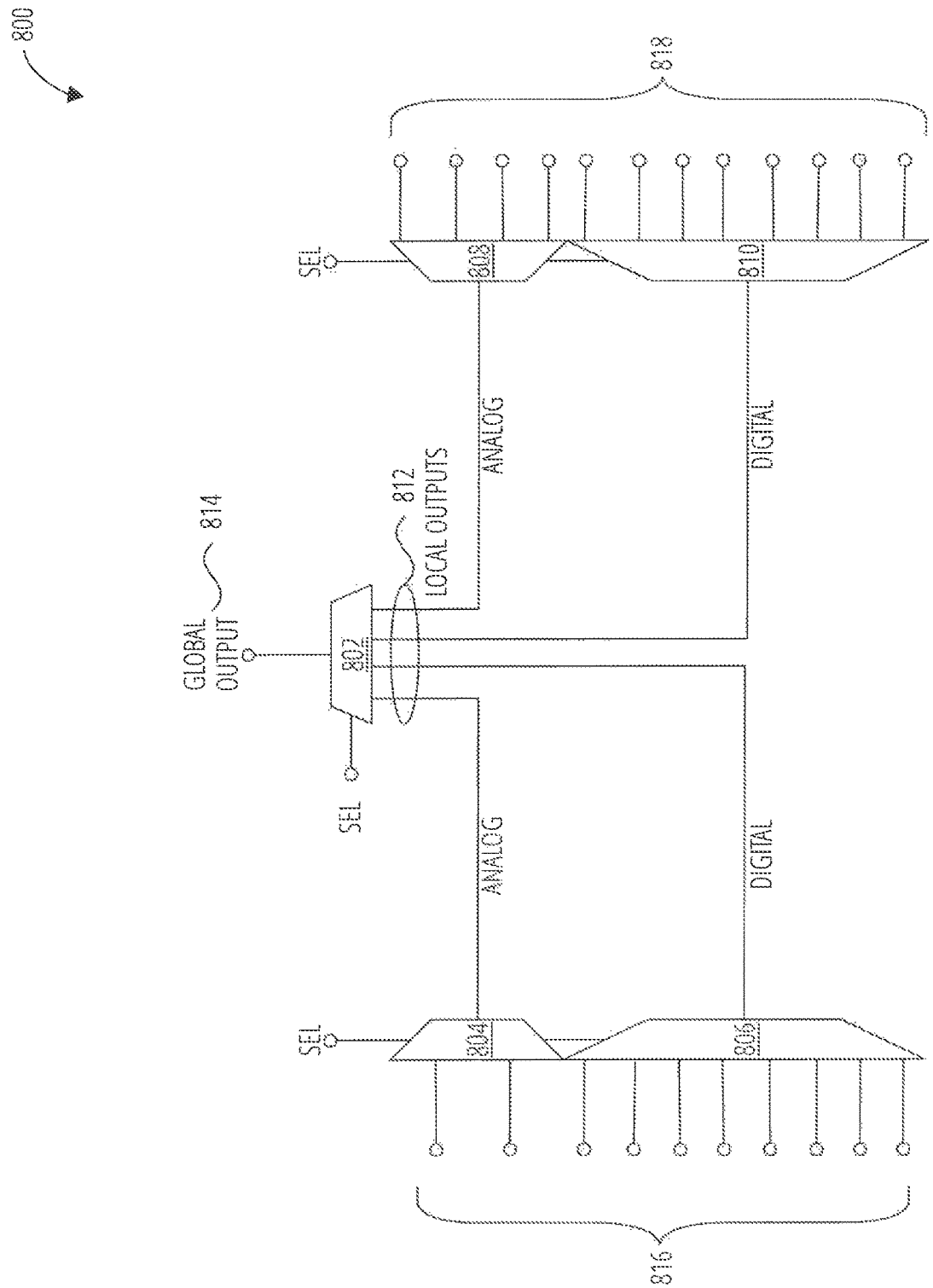
FIG. 8 is a schematic illustration of a multiplexing circuit, according to some embodiments.

FIG. 8 is a schematic illustration of a multiplexing circuit 800, according to some embodiments. The multiplexing circuit 800 may be used to multiplex TSV conductivity test results (e.g., TSV conductivity test results 816, TSV conductivity test results 818) from the edge TSVs (e.g., the edge TSVs, the VDD/VSS edge TSVs, the VDD/VSS/VPP edge TSVs of FIG. 6 and FIG. 7) to a global output 814. The multiplexing circuit 800 includes local multiplexers (e.g., local multiplexer 804, local multiplexer 806, local multiplexer 808, local multiplexer 810) configured to multiplex the TSV conductivity test results 816 and the TSV conductivity test results 818 to local outputs 812, some of which may be analog (e.g., to indicate detected voltage potentials on the TSVs) and some of which may be digital (e.g., to indicate whether the corresponding TSV passed or failed the conductivity test). The multiplexing circuit 800 also includes a global multiplexer 802 configured to multiplex the local outputs 812 into the global output 814.

Each of the multiplexers (global multiplexer 802, local multiplexer 804, local multiplexer 806, local multiplexer 808, local multiplexer 810) is configured to selectively output one of its inputs responsive to a select signal SEL. Accordingly, depending on a value of the select signal SEL, any one of the TSV conductivity test results 816 or TSV conductivity test results 818 may be provided at the global output 814. The control circuitry (e.g., control circuitry 224, control circuitry 412) may be configured to provide the select signal SEL, and receive the global output 814.

In some embodiments the local multiplexer 804, the local multiplexer 806, the local multiplexer 808, and/or the local multiplexer 810 may be configured to receive signals that are not related to the conductivity tests (e.g., signals related to other types of tests). As a result, the multiplexing circuit 800 may be configured to selectively output to the global output 814 any of the TSV conductivity test results 816 or TSV conductivity test results 818, or other signals related to other tests.

Figure 9:
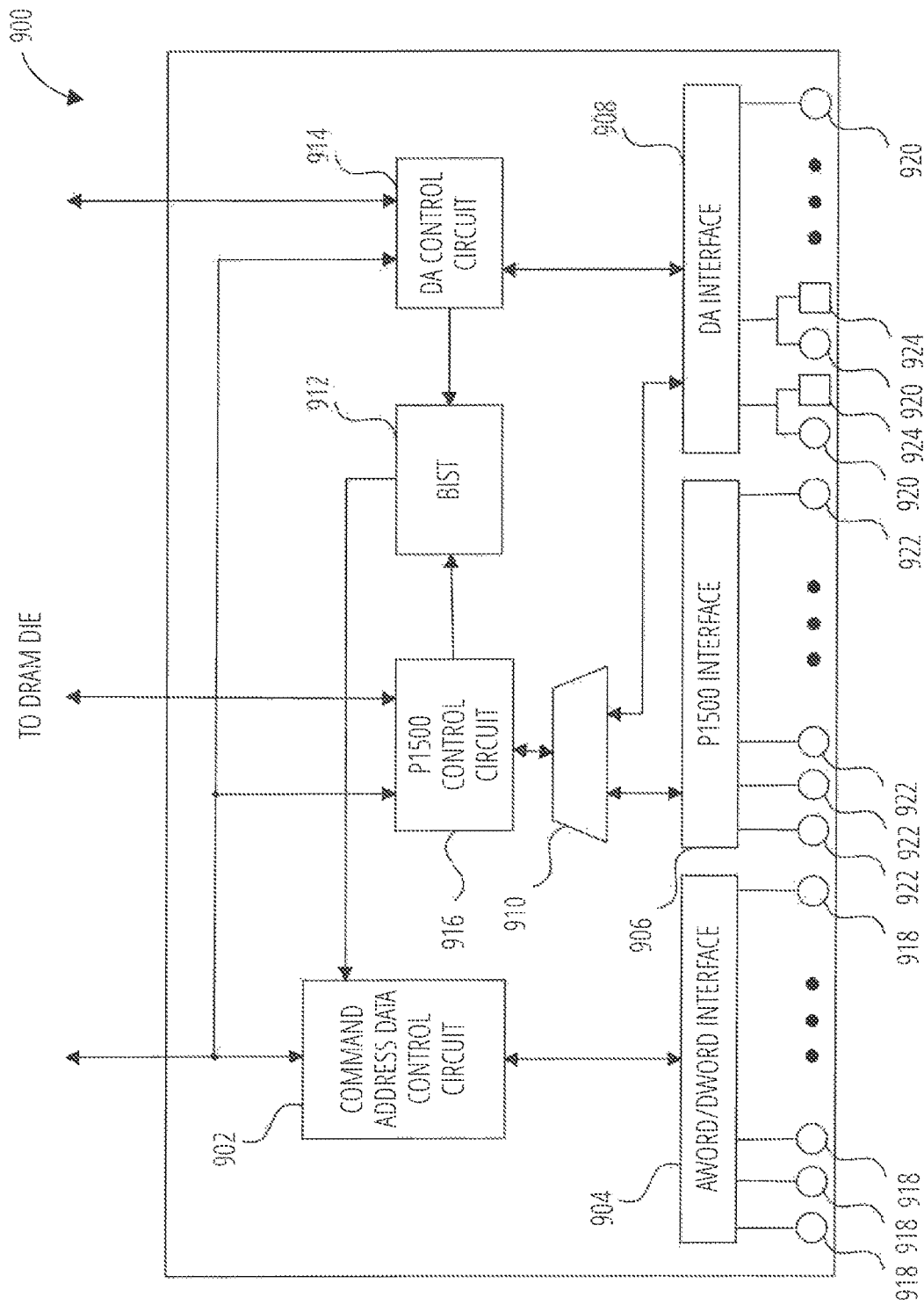
FIG. 9 is a block diagram of an example of a logic die of the electronic device 100 of FIG. 1.

FIG. 9 is a block diagram of an example of a logic die 900 of the electronic device 100 of FIG. 1. The logic die 900 includes an AWORD/DWORD interface 904, a P1500 interface 906, and a direct access interface, DA interface 908. The logic die 900 also includes a command address data control circuit 902 operably coupled to the AWORD/DWORD interface 904, a P1500 control circuit 916 operably coupled to the P1500 interface 906 via a multiplexer 910, and a DA control circuit 914 operably coupled to the DA interface 908. The command address data control circuit 902 is configured to control operation of the AWORD/DWORD interface 904, the P1500 control circuit 916 is configured to control operation of the P1500 interface 906, and the DA control circuit 914 is configured to control operation of the DA interface 908. Each of the command address data control circuit 902, the P1500 control circuit 916, and the DA control circuit 914 is configured to communicate directly with a DRAM die (e.g., DRAM die 1006 of FIG. 10). The P1500 control circuit 916 and the DA control circuit 914 are also configured to communicate indirectly with the DRAM die (e.g., DRAM die 1006 of FIG. 10) via a built in self-test, BIST 912. Furthermore, The P1500 control circuit 916 and the DA control circuit 914 are configured to engage in hybrid communications with the DRAM die (e.g., DRAM die 1006 of FIG. 10), wherein the hybrid communications include both direct and indirect (via the BIST 912) communications with the DRAM die (e.g., DRAM die 1006 of FIG. 10).

Figure 10:
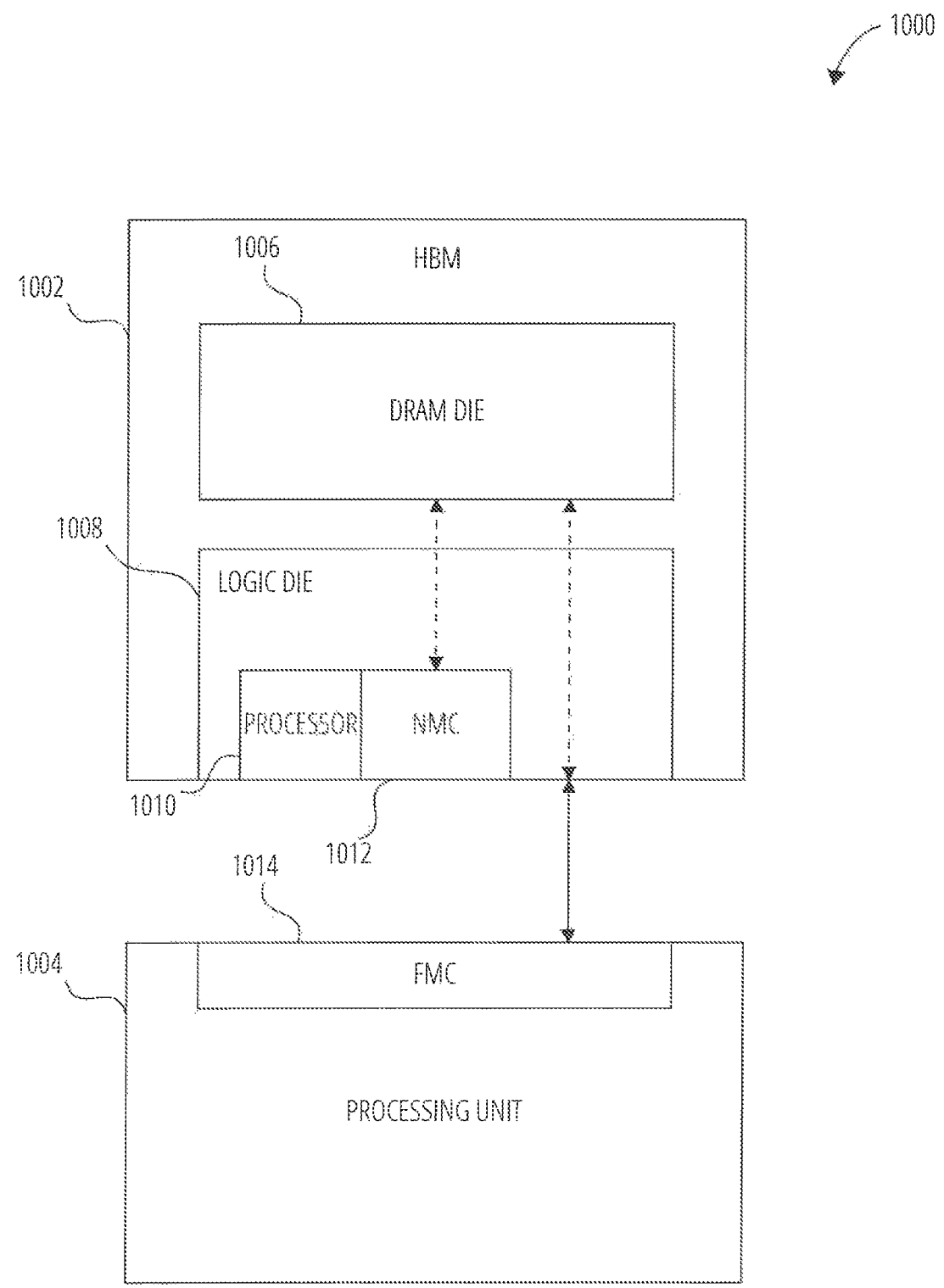
FIG. 10 is a block diagram of a high-bandwidth memory HBM+ system, according to some embodiments.

The AWORD/DWORD interface 904 is an interface for providing address/command (AWORD) and data (DWORD) for a normal operation of a high bandwidth memory (HBM 1002 of FIG. 10). By way of non-limiting example, the AWORD/DWORD interface 904 is configured to serve as an interface for conducting operational signals (e.g., commands, address signals, DQ input/output data signals, etc.). The AWORD/DWORD interface 904 includes AWORD/DWORD ports 918.

The P1500 interface 906 is an interface for testing operations specified by JEDEC. The P1500 interface 906 includes P1500 ports 922. A number of the P1500 ports 922, as specified by JEDEC, is fifteen P1500 ports 922. The P1500 test interface is a test interface between an embedded core and a system chip, which may be used to test core interoperability. Functions and circuits (e.g., P1500 control circuit 916) of P1500 interfaces between various different HBMs may be relatively similar because the JEDEC closely regulates the P1500 interface 906.

The DA interface 908 is an interface for other operations (e.g., mainly test operations). The DA interface 908 is undefined (maker/user specific) for other test operations. Some of these test operations may include the method 300 of FIG. 3, the method 500 of FIG. 5, other test operations discussed herein, or any combination thereof. Accordingly, the DA control circuit 914 may implement the control circuitry discussed herein (e.g., the control circuitry 224, the control circuitry 412).

The basic role of the DA interface 908 is to verify functions of the HBM (e.g., the electronic device 100 of FIG. 1) without using the other interfaces (e.g., the AWORD/DWORD interface 904, the P1500 interface 906). The DA interface 908 includes DA ports 920. At least some of the DA ports 920 have test pads 924. A number of the DA ports 920 is sixty DA ports 920. Functions and circuits (e.g., the DA control circuit 914) for the DA interface 908 may be relatively different from one HBM to another because the functions and circuits of the DA interface 908 are not as closely regulated as those of the P1500 interface 906. For example, JEDEC defines the number and placement of ubumps of the DA ports 920. Port assignment and usage of the DA interface 908 however, may vary from one HBM to another.

In FIG. 9 various arrows indicating directions of signals are shown. It should be noted that address/command signals and the corresponding test signals are driven from outside the logic die 900 toward the DRAM die 1006 (FIG. 10) in one direction. On the other hand, data signals and the corresponding test signals are driven in both directions (i.e., to and from the DRAM die 1006 of FIG. 10).

FIG. 10 is a block diagram of a high-bandwidth memory HBM+ system 1000, according to some embodiments. The HBM+ system 1000 includes an HBM 1002 and a processing unit 1004 (e.g., a central processing unit or CPU, a graphics processing unit or GPU, an accelerated processing unit or APU, etc.) operably coupled to the HBM 1002. The HBM 1002 includes a dynamic random access memory die, DRAM die 1006 and a logic die 1008. The logic die 1008 includes a processor 1010 and a near memory controller, NMC 1012. The processing unit 1004 includes a far memory controller, FMC 1014.

The NMC 1012 and the FMC 1014 are configured to function as memory controller masters. The FMC 1014 includes an off-HBM memory controller and the NMC 1012 includes an on-HBM memory controller that is located on the logic die 1008 of the HBM 1002. The logic die 1008 may be a control chip (e.g., the control chip 402 of FIG. 4). By way of non-limiting example, the logic die 1008 may correspond to a bottom layer of a 3D-stack memory that is the HBM 1002, while the DRAM die 1006 may correspond to one of the upper layers of the HBM 1002. The logic die 1008 may control the DRAM die 1006 using the NMC 1012, which may be instructed by the processor 1010 to control the DRAM die 1006. It should be noted that either or both of the NMC 1012 and the FMC 1014 may be represented by a general memory controller. The logic die 1008 may include the logic die 900 of FIG. 9.

Figure 11:
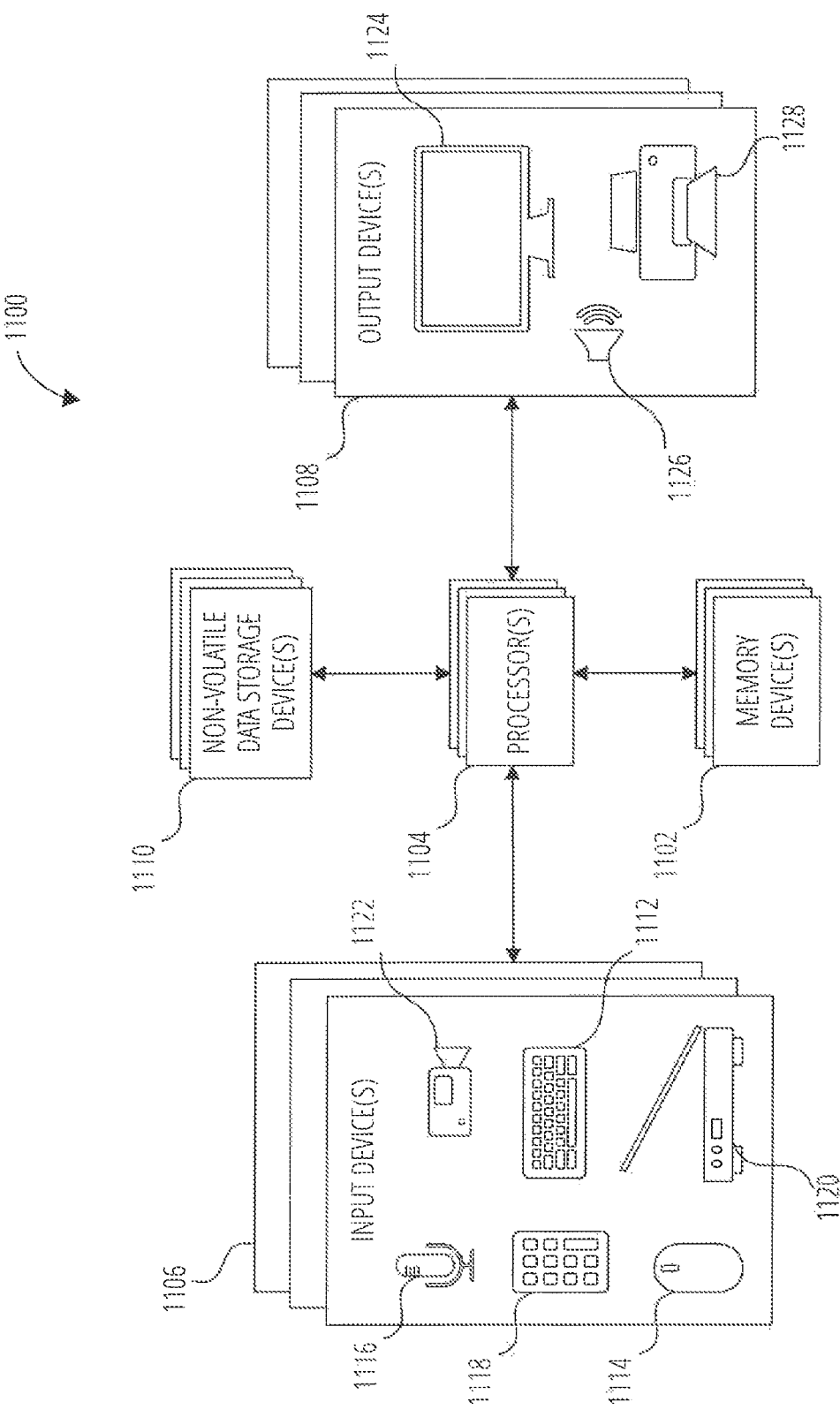
FIG. 11 is a block diagram of a computing system, according to some embodiments.

FIG. 11 is a block diagram of a computing system 1100, according to some embodiments. The computing system 1100 includes one or more processors 1104 operably coupled to one or more memory devices 1102, one or more non-volatile data storage devices 1110, one or more input devices 1106, and one or more output devices 1108. In some embodiments the computing system 1100 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 1104 may include a central processing unit (CPU) or other processor configured to control the computing system 1100. In some embodiments the one or more memory devices 1102 include random access memory (RAM), such as volatile data storage (e.g., dynamic RAM (DRAM) static RAM (SRAM), etc.). In some embodiments the one or more non-volatile data storage devices 1110 include a hard drive, a solid state drive, Flash memory, erasable programmable read only memory (EPROM), other non-volatile data storage devices, or any combination thereof. In some embodiments the one or more input devices 1106 include a keyboard 1112, a pointing device 1114 (e.g., a mouse, a track pad, etc.), a microphone 1116, a keypad 1118, a scanner 1120, a camera 1122, other input devices, or any combination thereof. In some embodiments the one or more output devices 1108 include an electronic display 1124, a speaker 1126, a printer 1128, other output devices, or any combination thereof.

In some embodiments the one or more memory devices 1102 include an HBM system such as the HBM+ system 1000 of FIG. 10. In some embodiments the one or more memory devices 1102 include a stack of chips (e.g., stack of chips 102 of FIG. 1, stack of chips 400 of FIG. 4, stack of chips 600 of FIG. 6) including the logic die 900 of FIG. 9.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An electronic device, comprising:
    a stack of chips including one or more side edges at a perimeter of the stack of chips, a through-silicon via zone (TSV zone) of the stack of chips within a predetermined distance from the one or more side edges;
    a first TSV within the TSV zone of the stack of chips at a first distance from the one or more side edges;
    a second TSV within the TSV zone of the stack of chips at a second distance from the one or more side edges, the second distance shorter than the first distance; and
    control circuitry on or in a control chip of the stack of chips, the control circuitry configured to identify a minimum acceptable TSV distance from the one or more side edges.

2. The electronic device of claim 1, wherein the control circuitry is configured to:
    perform a conductivity test on the first TSV and the second TSV; and
    identify the minimum acceptable TSV distance from the one or more side edges to be the first distance from the one or more side edges responsive to a determination that the first TSV passed the conductivity test, the second TSV failed the conductivity test, and no other TSVs further from the one or more side edges than the first TSV failed the conductivity test.

3. The electronic device of claim 1, wherein the control chip includes a logic die of a memory device.

4. The electronic device of claim 3, wherein the control circuitry includes a direct access (DA) control circuit of the logic die.

5. The electronic device of claim 2, wherein:
    the control chip is located at a first end of the first TSV;
    the control chip includes a first electrically controllable switch configured to selectively operably couple the first TSV proximate the first end of the first TSV to a first test voltage potential; and
    the stack of chips includes an end chip located at a second end of the first TSV opposite the first end, the end chip including a second electrically controllable switch configured to selectively operably couple the first TSV proximate to the second end to a second test voltage potential, the second test voltage potential different from the first test voltage potential.

6. The electronic device of claim 5, wherein the control circuitry is configured to:
    control the first electrically controllable switch to operably couple the first TSV to the first test voltage potential until the first end of the first TSV is charged to the first test voltage potential;
    control the second electrically controllable switch of the end chip to operably couple the first TSV to the second test voltage potential until the second end of the first TSV is discharged to the second test voltage potential;
    determine that the first TSV passed the conductivity test responsive to a determination that the first end of the first TSV is at the second test voltage potential; and
    determine that the first TSV failed the conductivity test responsive to a determination that the first end of the first TSV is at the first test voltage potential.

7. The electronic device of claim 2, wherein:
    the control chip is located at a first end of the second TSV;
    the control chip includes a first electrically controllable switch configured to selectively operably couple the second TSV proximate the first end of the second TSV to a first test voltage potential; and
    an end chip of the stack of chips, the end chip located at a second end of the second TSV opposite the first end, the end chip including a second electrically controllable switch configured to selectively operably couple the second TSV proximate to the second end to a second test voltage potential, the second test voltage potential different from the first test voltage potential.

8. The electronic device of claim 7, wherein the control circuitry is configured to:
    control the first electrically controllable switch to operably couple the second TSV to the first test voltage potential until the first end of the second TSV is charged to the first test voltage potential;
    control the second electrically controllable switch of the end chip to operably couple the second TSV to the second test voltage potential until the second end of the second TSV is discharged to the second test voltage potential;
    determine that the second TSV passed the conductivity test responsive to a determination that the first end of the second TSV is at the second test voltage potential; and
    determine that the second TSV failed the conductivity test responsive to a determination that the first end of the second TSV is at the first test voltage potential.

9. The electronic device of claim 2, further comprising a third TSV within the TSV zone of the stack of chips at a third distance from the one or more side edges, the third distance shorter than the second distance, wherein the control circuitry is configured to:
    perform the conductivity test on the third TSV; and
    identify the minimum acceptable TSV distance from the one or more side edges to be the second distance from the one or more side edges responsive to a determination that the first TSV and the second TSV passed the conductivity test, the third TSV failed the conductivity test, and no other TSVs further from the one or more side edges than the first TSV failed the conductivity test.

10. The electronic device of claim 2, wherein:
    the first TSV and the second TSV are located in a first zone of the TSV zone;
    a first plurality of TSVs of the first zone includes the first TSV and the second TSV; and the control chip includes a first local multiplexer configured to selectively provide one of a first plurality of TSV conductivity test results, each TSV conductivity test result of the first plurality corresponding to a different one of the first plurality of TSVs.

11. The electronic device of claim 10, further comprising a second plurality of TSVs located in a second zone of the TSV zone, wherein:
the control chip includes a second local multiplexer configured to selectively provide one of a second plurality of TSV conductivity test results, each TSV conductivity test result of the second plurality corresponding to a different one of the second plurality of TSVs;
a plurality of local multiplexers of the control chip includes the first local multiplexer and the second local multiplexer; and
the control chip includes a global multiplexer operably coupled to each of the plurality of local multiplexers, an output of the global multiplexer configured to selectively provide one of a plurality of outputs of the plurality of local multiplexers.

12. A method of determining a minimum acceptable through-silicon via distance (minimum acceptable TSV distance) from one or more side edges of a stack of chips, the method comprising:
performing a conductivity test on a first TSV located a first distance from the one or more side edges of the stack of chips;
performing the conductivity test on a second TSV located a second distance from the one or more side edges, the second distance shorter than the first distance; and
determining the minimum acceptable TSV distance from the one or more side edges to be the first distance responsive to a determination that the first TSV passed the conductivity test, the second TSV failed the conductivity test, and no other TSVs further from the one or more side edges than the first TSV failed the conductivity test.

13. The method of claim 12, wherein performing the conductivity test on a TSV includes:
pre-charging a first end of the TSV to a first test voltage potential;
discharging a second end of the TSV opposite the first end to a second test voltage potential;
detecting a voltage potential at the first end of the TSV;
determining that the TSV passed the conductivity test responsive to detecting the second test voltage potential at the first end of the TSV; and
determining that the TSV failed the conductivity test responsive to detecting the first test voltage potential at the first end of the TSV.

14. The method of claim 13, wherein pre-charging the first end of the TSV to the first test voltage potential comprises activating a switch operably coupled between the first end of the TSV and the first test voltage potential until the first end of the TSV is charged to the first test voltage potential.

15. The method of claim 13, wherein discharging the second end of the TSV to the second test voltage potential comprises activating a switch operably coupled between the second end of the TSV and the second test voltage potential until the second end of the TSV is discharged to the second test voltage potential.

16. A memory device, comprising:
a stack of chips including a logic die and a plurality of core dies stacked on the logic die;
a plurality of through-silicon vias (TSVs) at different distances from one or more side edges of the stack of chips, an ordered sequence associated with the plurality of TSVs from a furthest TSV from the one or more side edges to a nearest TSV to the one or more side edges; and
control circuitry on or in the logic die, the control circuitry configured to:
perform a conductivity test on each of the plurality of TSVs;
identify a TSV of the plurality of TSVs that is a last consecutive TSV in the ordered sequence to pass the conductivity test with no preceding TSVs in the ordered sequence failing the conductivity test; and
determine a minimum acceptable TSV distance from the one or more side edges to be the same as a distance from the identified TSV to the one or more side edges.

17. The memory device of claim 16, wherein the control circuitry comprises a direct access control circuit (DA control circuit).

18. The memory device of claim 16, wherein:
the plurality of TSVs is located at a first side edge of the one or more side edges;
the memory device further comprises an other plurality of TSVs at a second side edge of the one or more side edges, the second side edge different from the first side edge; and
the control circuitry is configured to determine another minimum acceptable TSV distance corresponding to the other plurality of TSVs independently from the determination of the minimum acceptable TSV distance corresponding to the plurality of TSVs.

19. A computing device including the memory device of claim 16.

20. The computing device of claim 19, further comprising:
one or more processors operably coupled to the memory device;
one or more non-volatile data storage devices operably coupled to the one or more processors;
one or more input devices operably coupled to the one or more processors; and
one or more output devices operably coupled to the one or more processors.

* * * * *